United States Patent
Fujihira et al.

(10) Patent No.: US 8,540,550 B2
(45) Date of Patent: Sep. 24, 2013

(54) GLASS SUBSTRATE POLISHING METHOD, PACKAGE MANUFACTURING METHOD, PIEZOELECTRIC VIBRATOR, OSCILLATOR, ELECTRONIC DEVICE AND RADIO TIMEPIECE

(75) Inventors: Youichi Fujihira, Chiba (JP);
Kazuyoshi Sugama, Chiba (JP)

(73) Assignee: Seiko Instruments Inc., Chiba (JP)

( * ) Notice: Subject to any disclaimer, the term of this patent is extended or adjusted under 35 U.S.C. 154(b) by 220 days.

(21) Appl. No.: 13/163,096

(22) Filed: Jun. 17, 2011

(65) Prior Publication Data

US 2011/0248788 A1     Oct. 13, 2011

Related U.S. Application Data

(63) Continuation of application No. PCT/JP2009/053332, filed on Feb. 25, 2009.

(51) Int. Cl.
*B24B 1/00* (2006.01)
(52) U.S. Cl.
USPC .............................. 451/41; 451/59; 331/156
(58) Field of Classification Search
USPC ..................................................... 451/41, 59
See application file for complete search history.

(56) References Cited

U.S. PATENT DOCUMENTS

| | | | |
|---|---|---|---|
| 6,491,572 B1 * | 12/2002 | Horie et al. | 451/63 |
| 6,537,938 B1 | 3/2003 | Miyazaki | |
| 7,294,951 B2 | 11/2007 | Oouchi et al. | |
| 2001/0055938 A1 | 12/2001 | Fujimura et al. | |
| 2006/0121834 A1 * | 6/2006 | Miyamoto | 451/41 |

FOREIGN PATENT DOCUMENTS

| | | |
|---|---|---|
| JP | 05-177539 A | 7/1993 |
| JP | 05-309559 A | 11/1993 |
| JP | 2001-072433 A | 3/2001 |
| JP | 2002-008223 A | 1/2002 |
| JP | 2006-157872 A | 6/2006 |
| JP | 2008-201645 A | 9/2008 |
| JP | 2008-252805 A | 10/2008 |

OTHER PUBLICATIONS

International Search Report for International Application No. PCT/JP2009/053332, dated Apr. 14, 2009, 2 pages.

* cited by examiner

*Primary Examiner* — Joseph Chang
(74) *Attorney, Agent, or Firm* — Brinks Hofer Gilson & Lione

(57) ABSTRACT

A glass substrate polishing method having polishing processes for polishing a glass substrate surface while supplying a polishing agent. The glass substrate polishing method is characterized in that the polishing processes include a first polishing process in which the surface of the glass substrate is polished using a first polishing pad made from a polishing cloth and a second polishing process in which the surface of the glass substrate is polished using a second polishing pad made from urethane foam.

12 Claims, 11 Drawing Sheets

GLASS SUBSTRATE POLISHING METHOD, PACKAGE MANUFACTURING METHOD, PIEZOELECTRIC VIBRATOR, OSCILLATOR, ELECTRONIC DEVICE AND RADIO TIMEPIECE

RELATED APPLICATIONS

This application is a continuation of PCT/JP2009/053332 filed on Feb. 25, 2009. The entire content of this application is incorporated herein by reference.

BACKGROUND OF THE INVENTION

1. Field of the Invention

The present invention relates to a glass substrate polishing method, a package manufacturing method, a piezoelectric vibrator, an oscillator, an electronic device and a radio timepiece.

2. Description of the Related Art

In recent years, mobile telephones and portable information terminal devices employ a piezoelectric vibrator that uses crystal or the like as a time source, a timing source of control signals or the like, and a reference signal source etc. Various examples of this type of piezoelectric vibrator are known. One known example is a surface mount device (SMD) type piezoelectric vibrator. This type of piezoelectric vibrator includes, for example, a base substrate and a lid substrate that are bonded to each other, a cavity that is formed between the two substrates, and a piezoelectric vibrating reed (an electronic component) that is housed in the cavity in an airtight sealed state.

This type of piezoelectric vibrator has a two-layer structure in which the base substrate and the lid substrate are directly bonded to each other, and the piezoelectric vibrating reed is housed in the cavity formed between the two substrates.

When this type of piezoelectric vibrator having the two-layer structure is manufactured, after the piezoelectric vibrating reed is mounted on the base substrate while a recessed portion for the cavity is formed on the lid substrate, both wafers are anodically bonded via a bonding layer. As a result of this, a plurality of piezoelectric vibrators (a package) is manufactured, in which the piezoelectric vibrating reed is airtightly enclosed in the cavity.

Patent Document 1: JP-A-5-177539

In the above-mentioned manufacturing method of the piezoelectric vibrator, when the base substrate and the lid substrate are bonded, it becomes important to bond flat surfaces of the two substrates while securing bonding areas (areas of bonding surfaces) and surface accuracy of the bonding surfaces of the two substrates, in order to maintain airtightness in the cavity.

Hence, when the two substrates are bonded, a polishing process is performed in advance in which the bonding surfaces of the two substrates are polished to improve the surface accuracy. One example of the polishing process is, for example, a polishing method that is disclosed in JP-A-5-177539 in which a carrier that retains a substrate is sandwiched between a pair of upper and lower surface plates that are respectively fitted with a polishing cloth, and both surfaces of the substrate are polished simultaneously by rotating and displacing the surface plates and the carrier relative to each other.

Among the above-described two substrates, particularly when the lid substrate is polished, by causing the polishing cloth to mainly slide on a tip end surface of a division wall that surrounds the recessed portion, it is considered possible to improve the surface accuracy of the division wall tip end surface, which is the boding surface with the base substrate.

However, when the lid substrate is polished using the polishing cloth, the polishing cloth wraps around as far as a peripheral edge of the tip end surface (the bonding surface) of the division wall and there is a possibility that a surface sag phenomenon occurs on a peripheral edge portion of the bonded surface. In concrete terms, the bonding surface is formed as a curved surface shape in which a thickness of a glass substrate gets thinner gradually from the center towards the outer peripheral edge side and the inner peripheral edge side. As a result of this, the bonding area with the base substrate becomes smaller, and there is a possibility that the airtightness in the cavity cannot be maintained. More specifically, when it is attempted to bond the two substrates, airtightness in the cavity cannot be secured due to a gap created between the bonding surfaces of the respective substrates, and there is a possibility of deterioration in vibration characteristics of the piezoelectric vibrator.

SUMMARY OF THE INVENTION

The invention has been made in light of the above-described problems, and it is an object thereof to provide a glass substrate polishing method, a package manufacturing method, a piezoelectric vibrator, an oscillator, an electronic device and a radio timepiece that are capable of improving surface accuracy of a bonding surface of a glass substrate and also of maintaining airtightness in a cavity by securing a bonding area.

In order to achieve the above-described object, a glass substrate polishing method according to the invention is a glass substrate polishing method having polishing processes for polishing a glass substrate surface while supplying a polishing agent. The glass substrate polishing method is characterized in that the polishing processes include a first polishing process in which the surface of the glass substrate is polished using a first polishing pad made from a polishing cloth and a second polishing process in which the surface of the glass substrate is polished using a second polishing pad made from urethane foam.

With this structure, in the first polishing process, by polishing the surface of the glass substrate using the first polishing pad made from the polishing cloth, it is possible to perform mirror-finish processing on the surface of the glass substrate and to improve the surface accuracy.

When the glass substrate is polished using the polishing cloth, as the polishing cloth wraps around as far as the peripheral edge of the glass substrate as described above, there is a possibility that a surface sag phenomenon occurs on the peripheral edge portion of the surface.

Therefore, in the second polishing process, by using a second polishing pad made from urethane foam that is harder than the polishing cloth, polishing can be performed without causing the surface sag on a corner portion etc. of the surface, while maintaining the surface accuracy of the surface of the glass substrate processed in the first polishing. More specifically, since the second polishing pad does not wrap around the rim of the corner portions of the glass substrate but only slides on the tip end surface of the glass substrate, it is possible to flatten out a surface sag section by actively polishing the tip end surface.

Therefore, since it is possible to improve the surface accuracy of the surface of the glass substrate and also to secure a large flat surface, it is possible to secure a bonding area in a case in which the surface of the glass substrate is bonded. As a result, it is possible to bond the glass substrate in a reliable manner while maintaining airtightness.

Further, the method is characterized in that a recessed portion is formed on the surface of the glass substrate and in that a tip end surface of a division wall is polished in the polishing processes, the division wall surrounding a periphery of the recessed portion.

As described above, when polishing is performed using the first polishing pad made from the polishing cloth, the polishing cloth wraps around the peripheral edge of the division wall surrounding the recessed portion and the surface sag occurs on the peripheral edge of the division wall.

In contrast to this, with the structure of the invention, by using the second polishing pad made from the urethane foam that is harder than the polishing cloth, it is possible to remove the surface sag section as the second polishing pad does not wrap around the peripheral edge of the corner portions of the glass substrate but only slides on the tip end surface of the glass substrate while actively polishing the tip end surface. Therefore, it is possible to flatten the tip end surface of the division wall of the glass substrate.

Further, the method is characterized in that in the first polishing process and the second polishing process, a two-sided polishing device is used and polishing is performed simultaneously also on a rear surface of the glass substrate.

With this structure, it is possible to simultaneously improve the surface accuracy of the rear surface of the glass substrate as well as that of the surface of the glass substrate.

Further, the method is characterized in that the two-sided polishing device includes a planetary gear mechanism that is provided with a disc-shaped carrier in which a retaining hole that houses the glass substrate is formed, and a lower surface plate and an upper surface plate which are disposed on upper and lower sides of the carrier and to which one of the first polishing pad and the second polishing pad is adhered, and in that in the polishing processes, the lower surface plate and the upper surface plate are pressed against the surface and the rear surface of the glass substrate via one of the first polishing pad and the second polishing pad, the carrier rotates on its own axis while revolving around an axis line, and a rotational direction of the lower surface plate is set to be in an opposite direction to a rotational direction of the upper surface plate.

With this structure, by rotating the respective surface plates in the opposite direction to each other, it is possible to increase resistance between the glass substrate and the polishing pad and to improve a polishing rate. Therefore, it is possible to improve work efficiency.

Further, the method is characterized in that in the second polishing process, the second polishing pad is used as the polishing pad of the lower surface plate and the lower surface plate polishes the surface side of the glass substrate, while a third polishing pad made from a material that is softer than the urethane foam is used as the polishing pad of the upper surface plate and the upper surface plate polishes the rear surface side of the glass substrate.

With this structure, since it is possible to increase the resistance between the surface of the glass substrate and the lower surface plate compared with the resistance between the rear surface of the glass substrate and the upper surface plate, it is possible to make the polishing rate of the surface of the glass substrate faster than the polishing speed of the rear surface. More specifically, when the surface of the glass substrate is considered as the bonding surface, it is possible to remove the surface sag by actively polishing the surface of the glass substrate only, the glass substrate surface becoming the bonding surface.

Further, a packaging manufacturing method of the invention is a package manufacturing method capable of enclosing an electronic component in a cavity formed between a plurality of substrates that are bonded to each other. The package manufacturing method is characterized by including: a recessed portion forming step of forming a recessed portion for the cavity on a surface of a first substrate among the plurality of substrates; a polishing step of polishing a tip end surface of a division wall that surrounds a periphery of the recessed portion, using the above-described glass substrate polishing method according to the invention; and a step of anodically bonding a second substrate among the plurality of substrates onto the tip end surface of the division wall.

With this structure, by performing polishing using the above-described glass substrate polishing method according to the invention, it is possible to flatten the surface sag section by actively polishing the tip end surface of the glass substrate, since the second polishing pad does not wrap around the peripheral edge of the bonding surface but only slides on the tip end surface of the glass substrate. In this way, it is possible to flatten a bonding surface of the first substrate.

Therefore, since it is possible to improve surface accuracy of the bonding surface of the first substrate and also to secure a large flat surface, it is possible to secure the bonding area in a case in which the bonding surface of the first substrate is bonded. As a result of this, it is possible to bond the first substrate and the second substrate together in a reliable manner and to maintain the airtightness in the cavity.

Further, a piezoelectric vibrator according to the invention is characterized by being manufactured using the above-described package manufacturing method of the invention.

With this structure, since the piezoelectric vibrator is manufactured using the above-described package manufacturing method of the invention, it is possible to provide a piezoelectric vibrator that has excellent vibration characteristics and is highly reliable.

Further, an oscillator according to the invention is characterized in that the above-described piezoelectric vibrator of the invention is electrically connected to an integrated circuit as an oscillation element.

Further, an electronic device according to the invention is characterized in that the above-described piezoelectric vibrator of the invention is electrically connected to a time measuring portion.

Further, a radio timepiece according to the invention is characterized in that the above-described piezoelectric vibrator of the invention is electrically connected to a filter portion.

Since the oscillator, the electronic device and the radio timepiece according to the invention are provided with the above-described piezoelectric vibrator, it is possible to provide products that have excellent vibration characteristics and are highly reliable.

With the glass substrate polishing method according to the invention, in the second polishing process, by using the second polishing pad made from the urethane foam that is harder than the polishing cloth, it is possible to perform polishing without causing the surface sag on the corner portions etc. of the glass substrate surface, while maintaining the surface accuracy of the glass substrate surface processed in the first polishing. More specifically, since the second polishing pad does not wrap around the peripheral edge of the corner portions of the glass substrate but only slides on the tip end surface of the glass substrate, it is possible to remove the surface sag section by actively polishing the flat end surface.

Therefore, since it is possible to improve the surface accuracy of the glass substrate surface and at the same time to secure a large flat surface, it is possible to secure the bonding area for bonding the glass substrate surface. As a result of this, it is possible to bond the glass substrate in a reliable manner while maintaining airtightness between the glass substrates.

Further, with the package manufacturing method according to the invention, by performing polishing using the above-described glass substrate polishing method of the invention, since it is possible to improve the surface accuracy of the bonding surface of the first substrate and at the same time to secure the flat surface, it is possible to secure the large bonding area for bonding the bonding surface of the first substrate. As a result of this, it is possible to bond anodically the first substrate and the second substrate together in a reliable manner and to maintain the airtightness in the cavity.

Further, with the piezoelectric vibrator according to the invention, since the piezoelectric vibrator is manufactured using the above-described package manufacturing method of the invention, it is possible to provide a piezoelectric vibrator that has excellent vibration characteristics and is highly reliable.

Since the oscillator, the electronic device and the radio timepiece according to the invention are provided with the above-described piezoelectric vibrator, it is possible to provide products that have excellent vibration characteristics and are highly reliable.

DETAILED DESCRIPTION OF THE PREFERRED EMBODIMENTS

Hereinafter, an embodiment of the invention will be described based on the drawings.
(Piezoelectric Vibrator)

Figure 1:
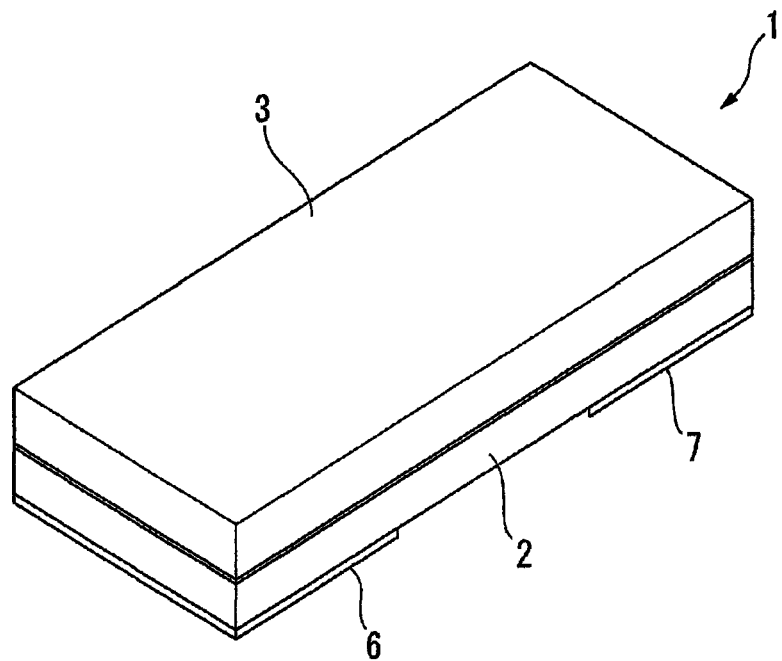
FIG. 1 is an external perspective view showing an example of a piezoelectric vibrator according to an embodiment of the invention.
Figure 2:
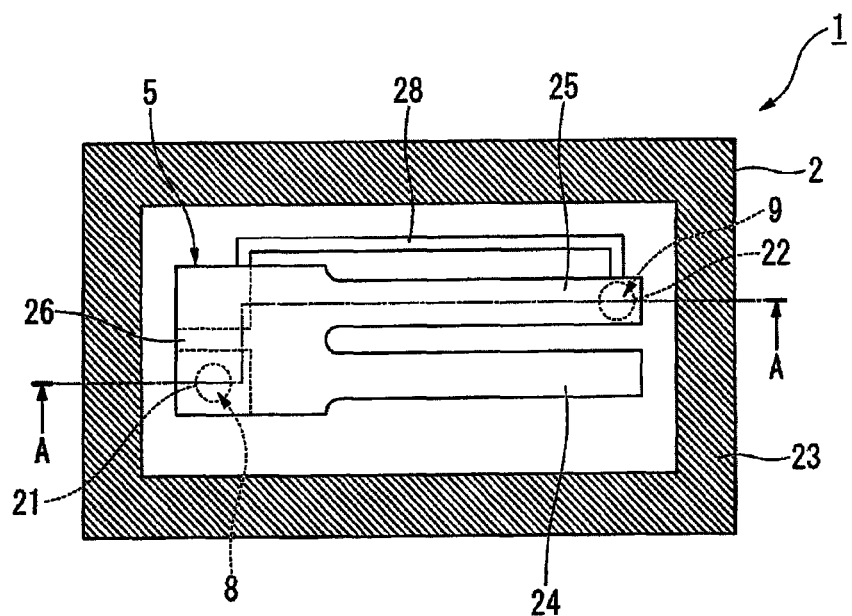
FIG. 2 is an internal structural view of the piezoelectric vibrator, and is a view showing a piezoelectric vibrating reed when viewed from above in a state in which a lid substrate is removed.
Figure 3:
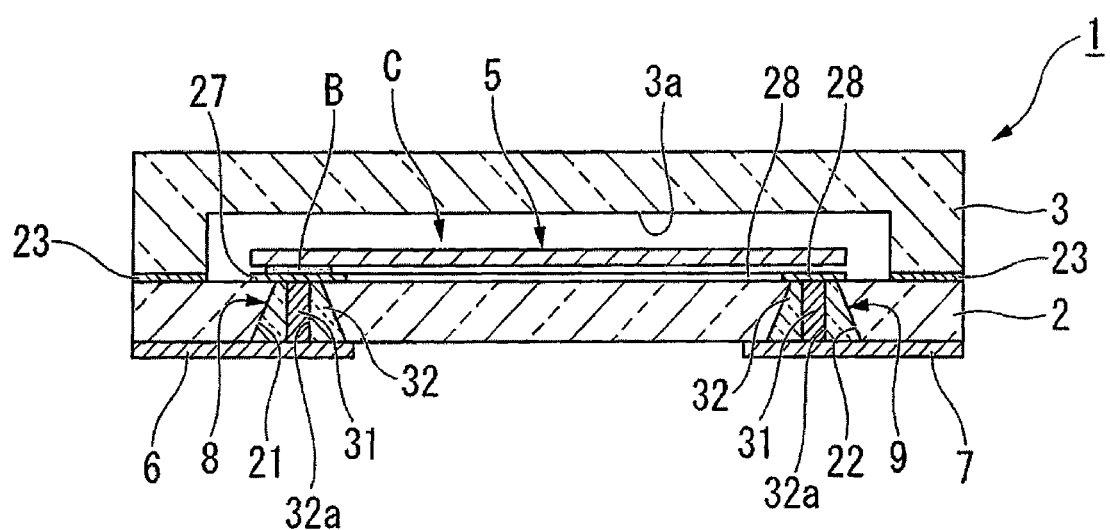
FIG. 3 is a cross-sectional view taken along a line A-A in FIG. 2.
Figure 4:
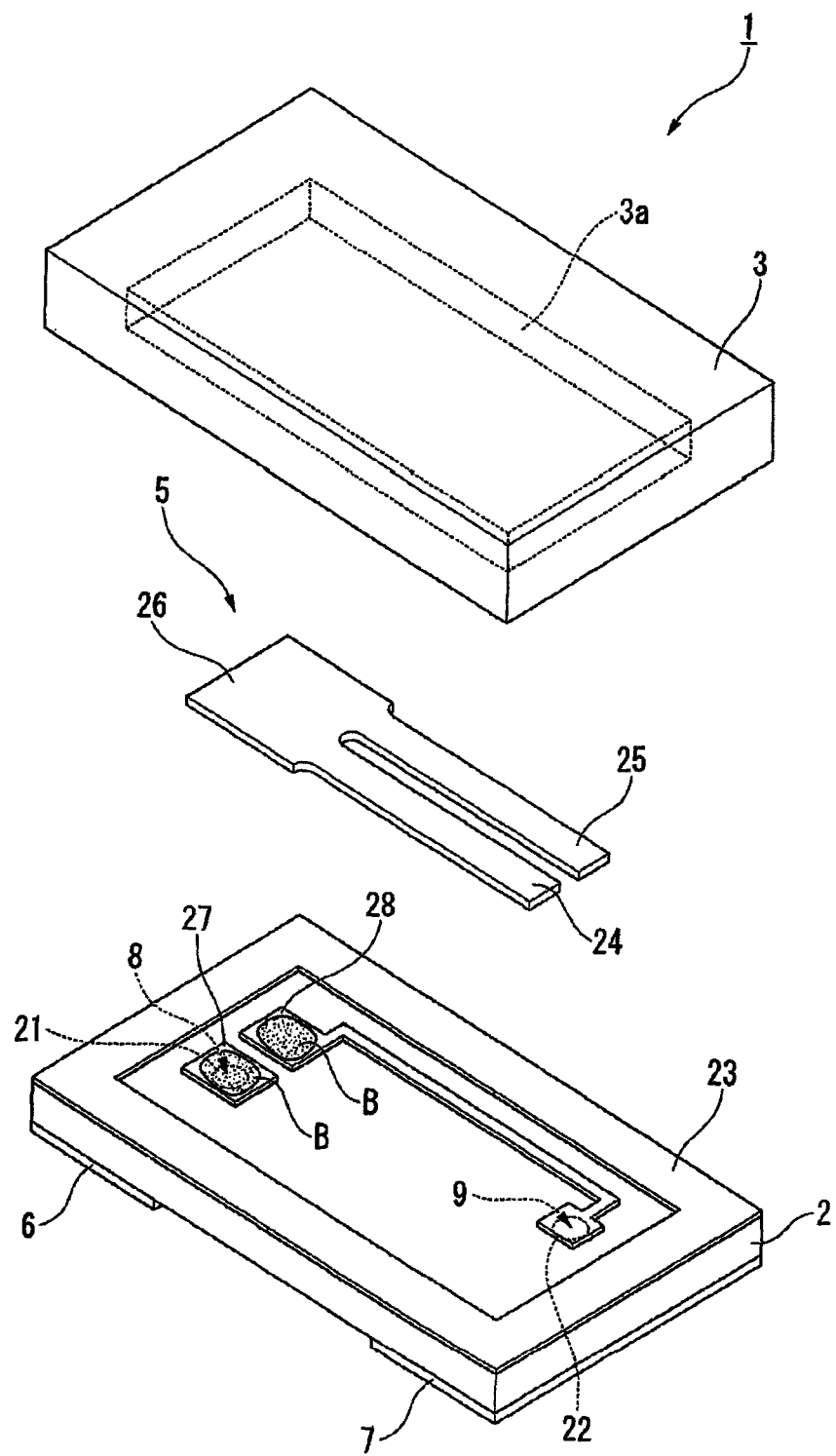
FIG. 4 is an exploded perspective view of the piezoelectric vibrator.

FIG. 1 is an external perspective view of a piezoelectric vibrator according to the embodiment. FIG. 2 is an internal structural view of the piezoelectric vibrator, and is a view showing a piezoelectric vibrating reed when viewed from above in a state in which a lid substrate is removed. Further, FIG. 3 is a cross-sectional view of the piezoelectric vibrator taken along a line A-A shown in FIG. 2, and FIG. 4 is an exploded perspective view of the piezoelectric vibrator.

As shown in FIG. 1 to FIG. 4, a piezoelectric vibrator 1 is formed in a box shape such that a base substrate 2 and a lid substrate 3 are laminated in two layers, and is the surface mount type piezoelectric vibrator 1 in which a piezoelectric vibrating reed 5 is housed in an internal cavity C. The piezoelectric vibrating reed 5 and external electrodes 6, 7 that are arranged on an outside of the base substrate 2 are electrically connected by a pair of through electrodes 8, 9 that penetrate the base substrate 2.

The base substrate 2 is a transparent insulating substrate made of a glass material, such as soda lime glass for example, and is formed in a plate shape. A pair of through holes 21, 22, in which the pair of through electrodes 8, 9 are formed, are formed in the base substrate 2. The through holes 21, 22 have a tapered cross section and the diameter is gradually reduced from a lower surface toward an upper surface of the base substrate 2.

Similarly to the base substrate 2, the lid substrate 3 is a transparent insulating substrate made of a glass material, such as soda lime glass for example, and is formed in a plate shape having a size that can be overlapped and aligned with the base substrate 2. A rectangular-shaped recessed portion 3a, in which the piezoelectric vibrating reed 5 is housed, is formed on a bonding surface side of the lid substrate 3 to which the base substrate 2 is bonded.

When the base substrate 2 and the lid substrate 3 are overlapped with each other, the recessed portion 3a forms the cavity C that houses the piezoelectric vibrating reed 5. The lid substrate 3 is anodically bonded to the base substrate 2 via a bonding layer 23, which will be described below, in a state in which the recessed portion 3a faces the base substrate 2 side.

The piezoelectric vibrating reed 5 is a tuning-fork type vibrating reed formed of a piezoelectric material, such as crystal, lithium tantalate, lithium niobate or the like, and it vibrates when a predetermined voltage is applied.

The piezoelectric vibrating reed 5 has a general U-shape in a plan view, and is formed by a pair of vibrating arm portions 24, 25 that are disposed parallel to each other, and a base portion 26 that integrally fixes a base end side of the pair of vibrating arm portions 24, 25. Provided on outer surfaces of the pair of vibrating arm portions 24, 25 are: a pair of excitation electrodes formed by a first excitation electrode and a second excitation electrode (which are not shown in the drawings) that vibrate the vibrating arm portions 24, 25; and a pair of mount electrodes (both of which are not shown in the drawings) that are electrically connected to the first excitation electrode and the second excitation electrode.

As shown in FIG. 3 and FIG. 4, the piezoelectric vibrating reed 5 structured in this manner is bump bonded onto routing electrodes 27, 28 formed on the upper surface of the base substrate 2, using a bump B such as gold. More specifically, the first excitation electrode of the piezoelectric vibrating reed 5 is bump bonded onto one of the routing electrodes, the routing electrode 27, via one of the mount electrodes and the bump B, and the second excitation electrode is bump bonded onto the other of the routing electrodes, the routing electrode 28, via the other of the mount electrodes and the bump B. Thus, the piezoelectric vibrating reed 5 is supported in a floating state with respect to the upper surface of the base substrate 2. At the same time, each of the mount electrodes and the routing electrodes 27, 28 are respectively electrically connected.

Then, on the upper surface side of the base substrate 2 (on the bonding surface side to which the lid substrate 3 is bonded), the bonding layer 23 for anodic bonding is formed, the bonding layer 23 being made of a conductive material (for example, aluminum). The bonding layer 23 is formed along a peripheral edge of the base substrate 2 such that the bonding layer 23 surrounds a periphery of the recessed portion 3a formed in the lid substrate 3. Then, the base substrate 2 and the lid substrate 3 are anodically bonded via the bonding layer 23 with respect to the base substrate 2 in a state in which the recessed portion 3a faces the bonded surface side of the base substrate 2.

Further, the external electrodes 6, 7 are provided on both ends, in a longitudinal direction, of the lower surface of the base substrate 2, and are electrically connected to the piezoelectric vibrating reed 5 via each of the through electrodes 8, 9 and each of the routing electrodes 27, 28. More specifically, one of the external electrodes, the external electrode 6, is electrically connected to one of the mount electrodes of the piezoelectric vibrating reed 5 via one of the through electrodes, the through electrode 8, and one of the routing electrodes, the routing electrode 27. Meanwhile, the other of the external electrodes, the external electrode 7, is electrically connected to the other of the mount electrodes of the piezoelectric vibrating reed 5 via the other of the through electrodes, the through electrode 9, and the other of the routing electrodes, the routing electrode 28.

The through electrodes 8, 9 are formed by cases 32 and core portions 31 that are integrally fixed to the through holes 21, 22 by firing. The through electrodes 8, 9 maintain the airtightness in the cavity C by completely blocking the through holes 21, 22, and at the same time, play a role of making the external electrodes 6, 7 and the routing electrodes 27, 28 electrically conductive to each other. In concrete terms, one of the through electrodes, the through electrode 8, is located below the routing electrode 27 and between the external electrode 6 and the base portion 26. The other of the through electrodes, the through electrode 9, is located above the external electrode 7 and below the routing electrode 28.

The cases 32 are formed by firing a glass frit in a paste form. The cases 32 are formed in a cylindrical shape having flat surfaces at both ends and roughly the same thickness as the base substrate 2. The core portions 31 are provided at the center of the cases 32, such that the core portions 31 penetrate through central holes 32a of the cases 32. Further, in the embodiment, an outer shape of the cases 32 is formed to be in a conical shape (a tapered cross section) corresponding with a shape of the through holes 21, 22. Then, the cases 32 are fired in a state in which the cases 32 are respectively embedded in the through holes 21, 22 and they are firmly fixed to the through holes 21, 22.

The above-described core portions 31 are electrically conductive cores formed of metal material in a cylindrical shape, and similarly to the cases 32, the core portions 31 are formed to have flat surfaces at both ends and roughly the same thickness as the base substrate 2.

Note that electrical conductivity is secured for the through electrodes 8, 9 via the electrically conductive core portions 31.

When the piezoelectric vibrator 1 structured in the above-described manner is operated, a predetermined driving voltage is applied to the external electrodes 6, 7 that are formed in the base substrate 2. Thus, it is possible to apply an electric current to each of the excitation electrodes of the piezoelectric vibrating reed 5 and it is possible to cause the pair of vibrating arm portions 24, 25 to vibrate at a predetermined frequency in approaching and separating directions. Then, the vibration of a pair of the vibrating arm portions 24, 25 can be used as a time source, a timing source of control signals, a reference signal source and the like.

(Piezoelectric Vibrator Manufacturing Method)

Next, a manufacturing method of the above-described piezoelectric vibrator will be described with reference to a flowchart shown in FIG. 5.

(First Wafer Forming Process)

Figure 5:
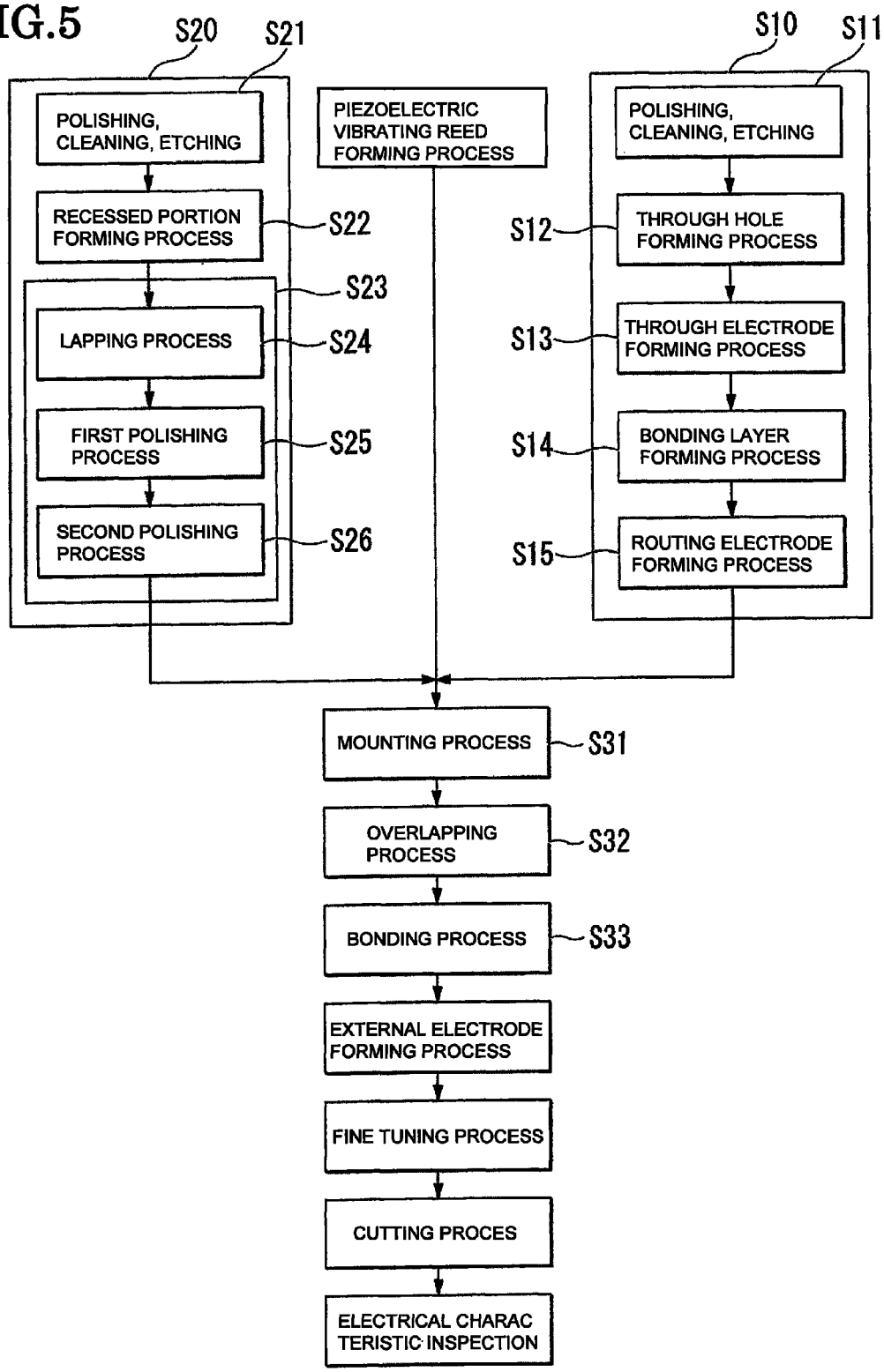
FIG. 5 is a flowchart showing a manufacturing flow of the piezoelectric vibrator shown in FIG. 1.

First, as shown in FIG. 5, a first wafer forming process is performed (S10) in which a base substrate wafer, which will become the base substrate 2 at a later stage, is formed up to a state immediately before performing the anodic bonding. First, after the soda lime glass is polished and processed to a predetermined thickness and then cleaned, the disc-shaped base substrate wafer (refer to FIG. 7), from which a work-affected layer on an outermost surface has been removed by etching or the like, is formed (S11). Next, by using press working etc, for example, a through hole forming process is performed (S12) in which a plurality of the through holes 21, 22 for disposing the pair of through electrodes 8, 9 in the base substrate wafer are formed. In concrete terms, after forming the recessed portion on a surface of the base substrate wafer by press working, it is possible to form the through holes 21, 22 by polishing the base substrate wafer from the rear surface side and penetrating through the recessed portion.

Subsequently, a through electrode forming process is performed (S13) in which the through electrodes 8, 9 are formed inside the through holes 21, 22 that are formed in the through hole forming process (S12). By this, the core portion 31 can be maintained in each of the through holes 21, 22 such that it is flush with the surface of the base substrate wafer. With the above-described processes, it is possible to form the through electrodes 8, 9.

Next, a bonding layer forming process is performed (S14) in which a conductive material is patterned onto the upper surface of the base substrate wafer and the bonding layer 23 is thereby formed. At the same time, a routing electrode forming process is performed (S15). In this way, the first wafer forming process (S10) is completed.

(Second Wafer Forming Process)

Figure 8:
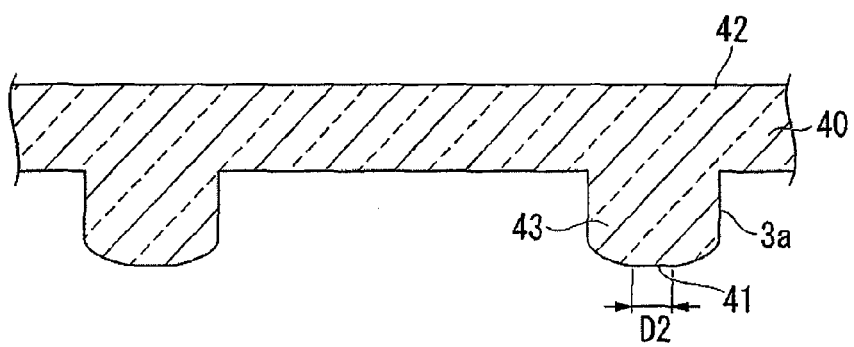
FIG. 8 is a process chart illustrating the second wafer forming process, and is a view showing a cross section of the lid substrate wafer.
Figure 9:
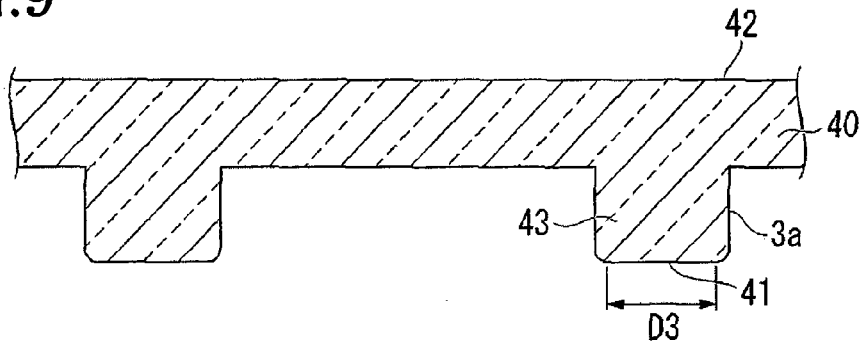
FIG. 9 is a process chart illustrating the second wafer forming process, and is a view showing a cross section of the lid substrate wafer.
Figure 10:
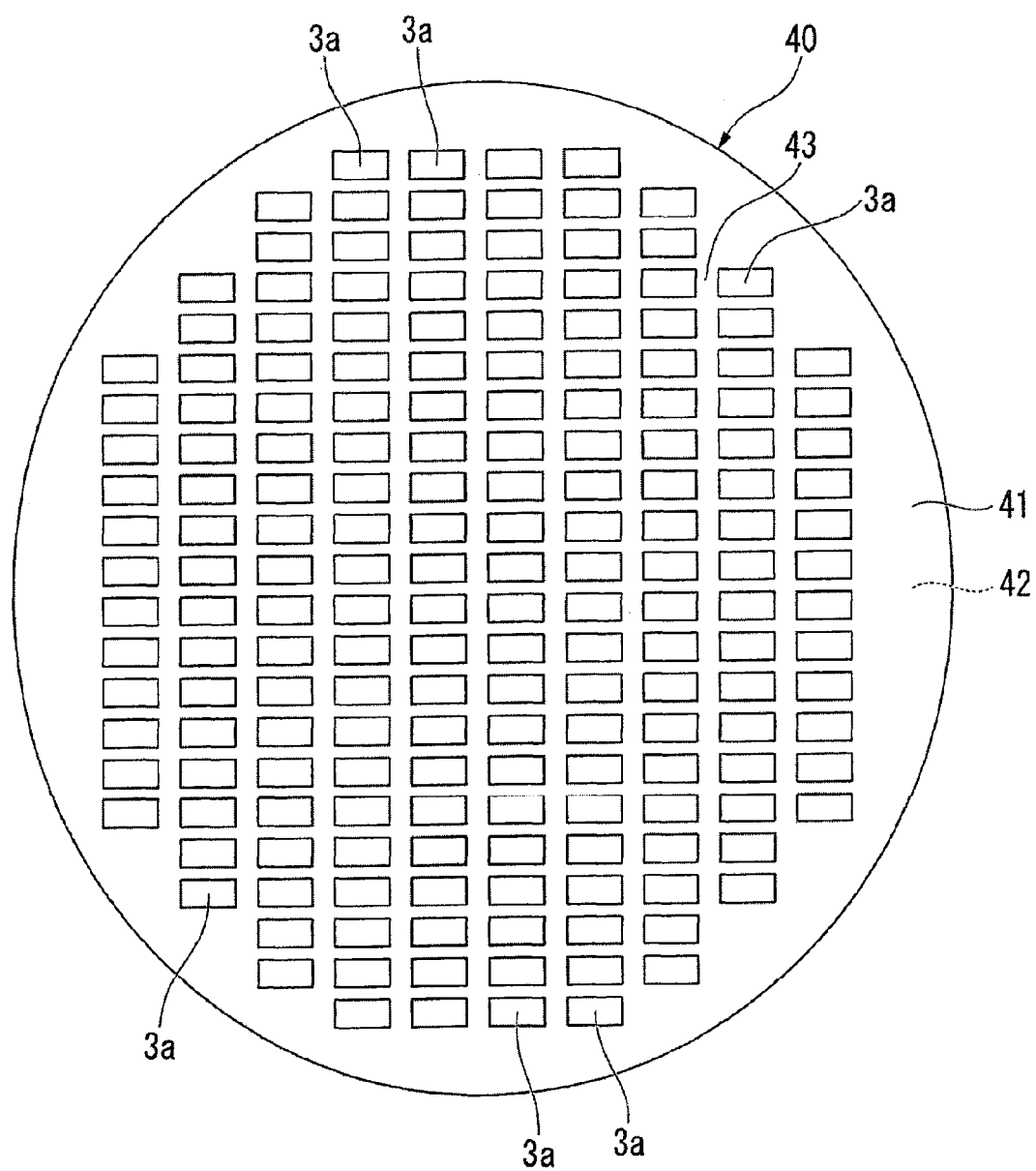
FIG. 10 is a process chart illustrating the second wafer forming process, and is a view showing the lid substrate wafer when viewed from a flat surface.

FIG. 6 to FIG. 10 are process charts illustrating a second wafer forming process. FIG. 6 to FIG. 9 are cross-sectional views of a lid substrate wafer, and FIG. 10 is a plan view of the lid substrate wafer.

Figure 6:
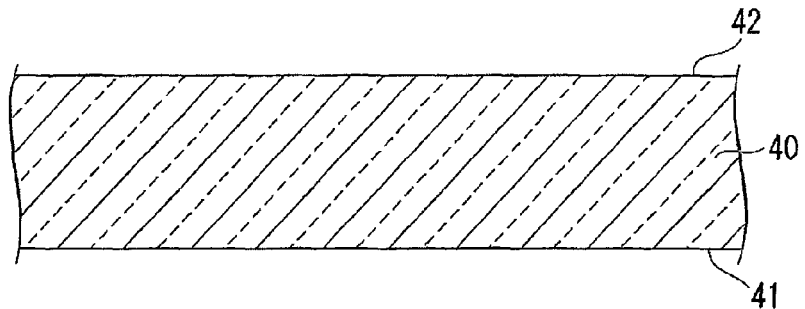
FIG. 6 is a process chart illustrating a second wafer forming process, and is a view showing a cross section of a lid substrate wafer.
Figure 7:
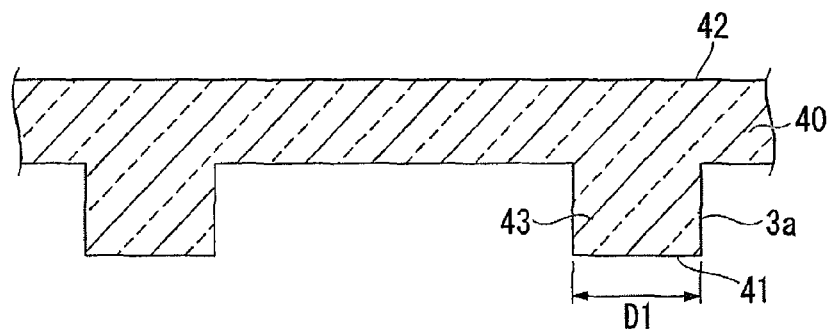
FIG. 7 is a process chart illustrating the second wafer forming process, and is a view showing a cross section of the lid substrate wafer.

Next, concurrently with the above-described process, or at a timing before or after it, a second wafer forming process is performed (S20) in which a lid substrate wafer 40 which later becomes the lid substrate 3, is formed up to a state immediately before performing anodic bonding. In concrete terms, as shown in FIG. 6, after the soda lime glass is polished and processed to a predetermined thickness and then cleaned, the disc-shaped lid substrate wafer 40, from which a work-affected layer on an outermost surface has been removed by etching or the like, is formed (S21). Next, as shown in FIG. 7 and FIG. 10, a recessed portion forming process is performed (S22), in which a plurality of the recessed portions 3a for the cavity C are formed in a row direction by etching or the like on a bonding surface 41 of the lid substrate wafer 40.

(Polishing Process)

Next, a polishing process (S23) is performed in which at least the bonding surface 41 of the lid substrate wafer 40 is polished. In the polishing process (S23), first, a two-sided lapping device, which is not shown in the drawings, is used to perform a lapping (rough grinding) process (lapping process: S24) on both surfaces of the lid substrate wafer 40 (the bonding surface 41 and a surface 42 opposing the bonding surface 41 (hereinafter referred to as a rear surface 42)). In concrete terms, the lid substrate wafer 40 is pinched and held by a lap made of cast iron or the like via a lapping powder, and the lap and the lid substrate wafer 40 are relatively displaced. In this way, it is possible to roughly grind both the surfaces 41, 42 of the lid substrate wafer 40.

Subsequently, in order to mirror finish at least the bonding surface 41 of the lid substrate wafer 40, a first polishing process is performed (S25). In the first polishing process, the process is performed using a two-sided polishing device 71, which is manufactured by a company S and which simultaneously polishes both the surfaces 41, 42 of the lid substrate wafer 40.

(Two-Sided Polishing Device)

Figure 11:
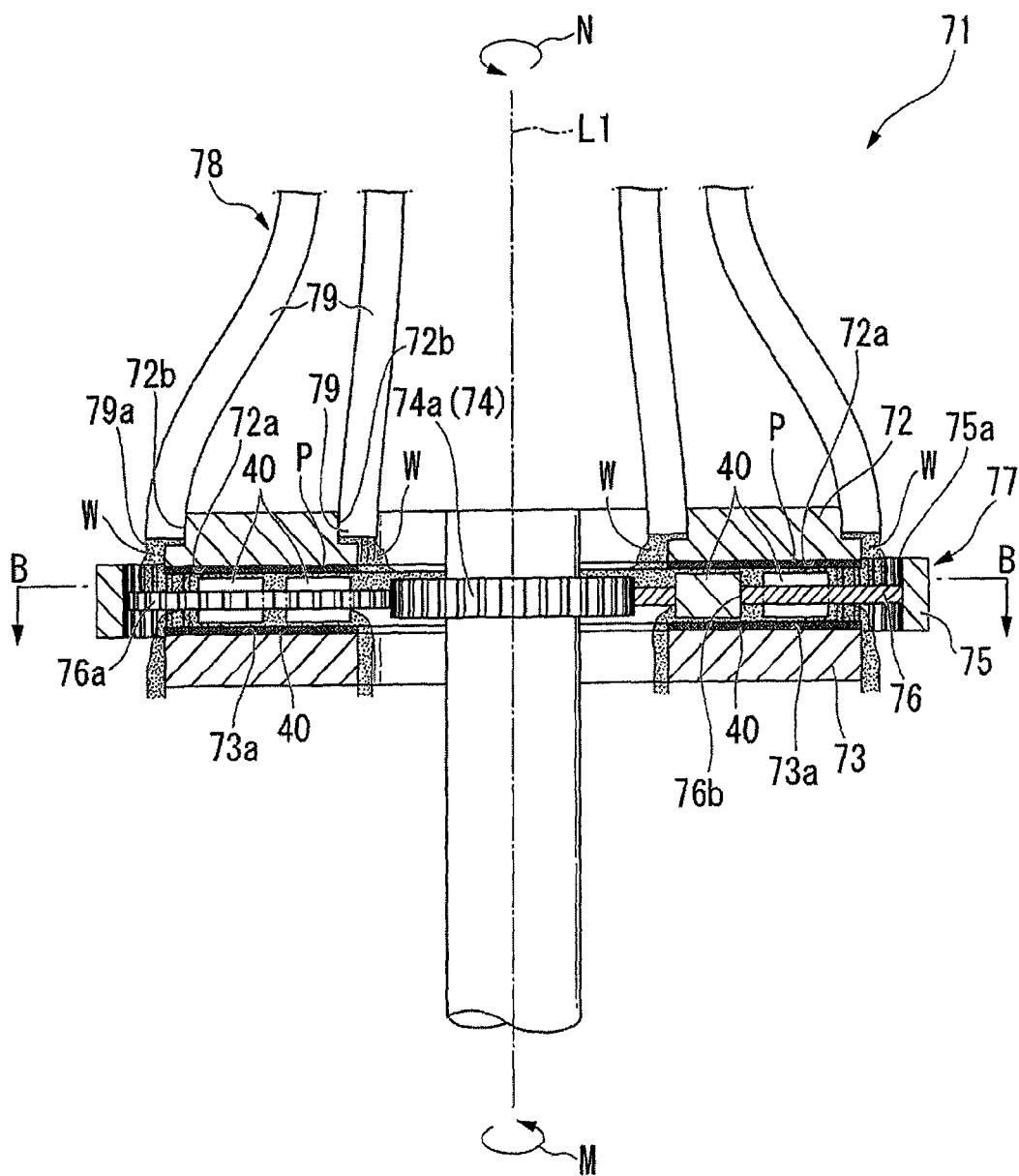
FIG. 11 is a cross-sectional view (a side view) of a two-sided polishing device used in a polishing process.
Figure 12:
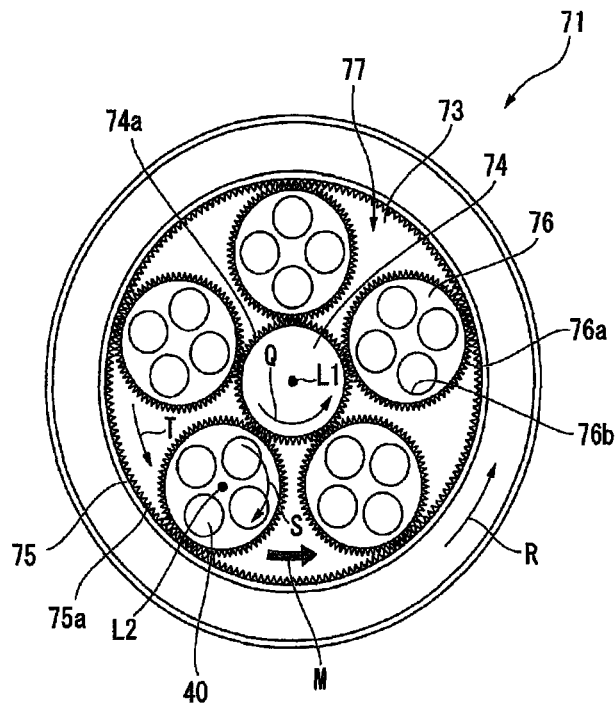
FIG. 12 is a plan view of the two-sided polishing device.

FIG. 11 is a cross-sectional view (a side view) of the two-sided polishing device, and FIG. 12 is a plan view of the two-sided polishing device.

As shown in FIG. 11 and FIG. 12, the two-sided polishing device 71 mainly includes: an upper surface plate 72 having a round shape in a plan view; a lower surface plate 73 that is formed in the same shape as the upper surface plate 72 in a plan view; a sun gear 74 located at the center of the lower surface plate 73; an internal gear 75 surrounding an outer periphery of the lower surface plate 73; a plurality of carriers 76 that retain the lid substrate wafer 40, the plurality of carriers 76 being provided between the upper surface plate 72 and the lower surface plate 73 and between the sun gear 74 and the internal gear 75; polishing agent supplying means 78 that supplies a polishing agent W to both the surfaces 41, 42 of the base substrate wafer 40 and driving means, not shown in the drawings, for driving the upper surface plate 72, the lower surface plate 73, the sun gear 74 and the internal gear 75 to rotate independently.

The upper surface plate 72 and the lower surface plate 73 are disc-shaped plates arranged respectively on a same axis L1 and are rotatably supported around an axis line L1. Pad retaining portions 72a, 73a, to which polishing pads P are adhered, are provided on polishing-side surfaces of each of the surface plates 72, 73.

Gears 74a and 75a are provided on an outer circumference of the sun gear 74 and an inner circumference of the internal gear 75, the gears 74a and 75a being provided at a regular pitch in a perpendicular and circular manner. The sun gear 74 and the internal gear 75 are arranged on the same axis L1 with the upper surface plate 72 and the lower surface plate 73 such that the sun gear 74 and the internal gear 75 rotate around the axis line L1.

Therefore, the carriers 76 are disk-shaped, and in an inner side of the carriers 76, a plurality of wafer retaining holes 76b, into which the lid substrate wafer 40 is inserted and can be retained, are formed at regular intervals along the circumferential direction. With respect to the carriers 76, their thickness is formed thinner than that of the lid substrate wafer 40. The carriers 76 retain a side surface of the lid substrate wafer 40 in a way in which the lid substrate wafer 40 protrudes from upper and lower sides of the carriers 76.

Further, gears (gear portions) 76a are provided on an outer circumference of the carriers 76 at a regular pitch in a perpendicular and circular manner. Each of the carriers 76 is not fixed and is structured to rotate on its own axis and to revolve as the gears 76a of the carriers 76 engage with the gears 74a, 75a of the rotating sun gear 74 and the internal gear 75. The sun gear 74 and the internal gear 75 are designed to be rotated in the counterclockwise direction (refer to arrows Q, R in FIG. 12) by the above-mentioned driving means. At this time, rotational speeds of the sun gear 74 and the internal gear 75 are adjusted such that the respective gears rotate at different rotational speeds. As a result of this, each of the carriers 76 rotates around an axis line L2 in the clockwise direction (refer to an arrow S in FIG. 12) while revolving around the axis line L1 in the counterclockwise direction (refer to an arrow T in FIG. 12). In short, the carriers 76, the sun gear 74 and the internal gear 75 function as a planetary gear mechanism 77 that causes each of the carriers 76 to rotate on its own axis while revolving around the axis line L1.

The polishing agent supplying means 78 includes a container portion, which is not shown in the drawings, that is provided with a motor and that contains and stirs the polishing agent W, and a plurality of supply hoses 79 that are connected to the container portion via a pump at one end while supply ports 79a of the other ends are connected to the upper surface plate 72. Then, the polishing agent W is fed into the supply hoses 79 from the container portion by the pump and supplied at a point between the polishing pads P of the respective surface plates 72, 73 and both the sides 41, 42 of the lid substrate wafer 40, from supply holes 72b that are formed in the upper surface plate 72. Note that the polishing agent supplying means 78 is provided with a polishing agent collection portion (not shown in the drawings) that collects the polishing agent W that flows outside from the lower surface plate 73, and there is a mechanism by which the collected polishing agent W can be delivered back to the supply hoses 79 again. Note that cerium oxide etc., which is generally used for polishing a glass surface, is preferably used as the polishing agent W.

When the first polishing process (S25) is performed using this type of the two-sided polishing device 71, first, the polishing pads are adhered to the pad retaining portions 72a, 73a, and at the same time, the lid substrate wafers 40 are inserted into the wafer retaining holes 76b. Note that a cerium pad etc. is preferably used as the polishing pad (a first polishing pad) P that is used in the first polishing process, the cerium pad being a nonwoven fabric, a suede polishing cloth and the like, for example.

Then, by driving the polishing agent supplying means 78, the polishing agent W is supplied from the supply ports 79a at a point between the polishing pads P of the respective surface plates 72, 73 and both the sides 41, 42 of the lid substrate wafer 40. After this, by driving the driving means of the upper surface plate 72, the lower surface plate 73, the sun gear 74 and the internal gear 75, the respective surface plates 72, 73 and the respective gears 74, 75 are rotated around the axis line L1.

Figure 13:
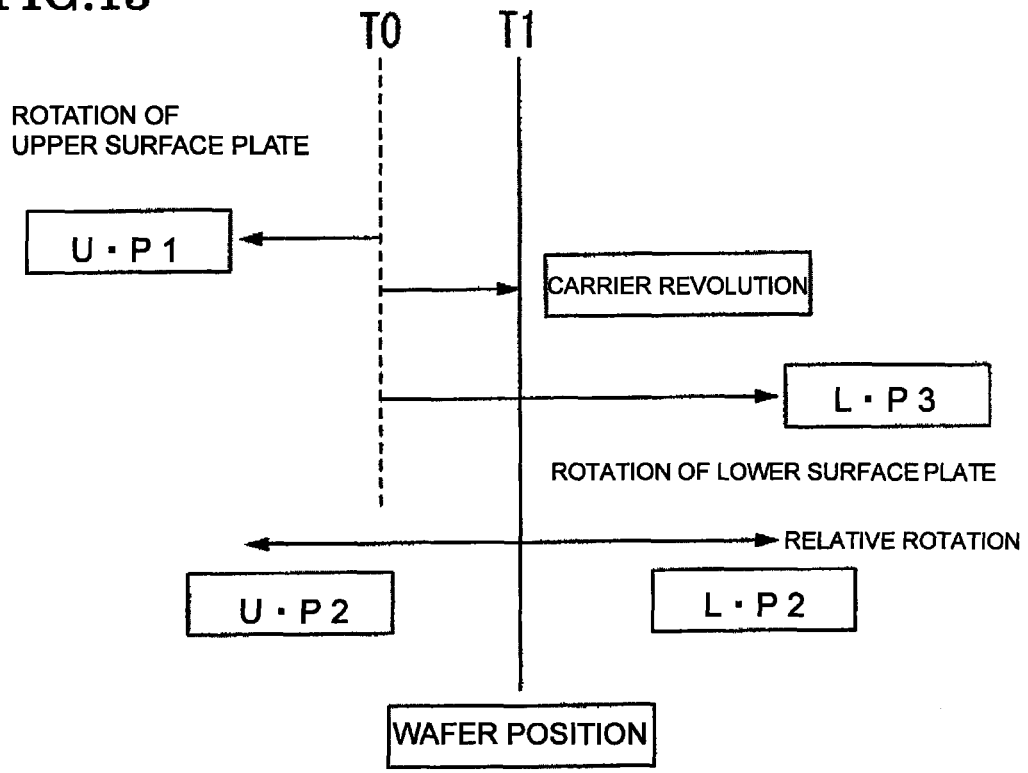
FIG. 13 is a diagram showing relationships between rotation directions and rotational speed ratios of respective surface plates and a relative rotational ratio of a carrier.

Here, FIG. 13 is a diagram showing relationships between rotation directions and rotational speed ratios of the respective surface plates 72, 73 and a relative rotational ratio of the carrier 76.

As shown in FIG. 12 and FIG. 13, in the polishing processes according to the embodiment, a so-called four-way method is adopted in which all the respective surface plates 72, 73 and the respective gears 74, 75 are independently driven to rotate. In concrete terms, the lower surface plate 73 and the upper surface plate 72 are respectively rotated around the axis line L1 in the opposite direction to each other. In this case, when it is assumed that a rotational direction of the upper surface plate 72 is clockwise (an arrow N in FIG. 11) and a rotational speed ratio per a predetermined time period T1 is 1 (U•P1 in FIG. 13), a rotational direction of the lower surface plate 73 is set to be counterclockwise (an arrow M in FIG. 12) and the rotational speed ratio is set to be 3 (L•P3 in FIG. 13). More specifically, the lower surface plate 73 and the upper surface plate 72 are set to be rotated in the opposite direction to each other, and at the same time, the rotational speed ratio per the predetermined time period Ti is set to be 3:1.

In this way, by causing the respective surface plates 72, 73 to rotate in the opposite direction to each other, it is possible to increase resistance between the lid substrate wafer 40 and the polishing pads P and to improve polishing speed. Therefore, it is possible to improve work efficiency.

Note that as described above, the sun gear 74 and the internal gear 75 are adjusted to rotate in the counterclockwise direction (refer to the arrows L, R in FIG. 12) and also to rotate at the different rotational speeds respectively. As a result of this, each of the carriers 76 rotates around the axis line L2 while revolving around the axis line L1. In this case, a revolving direction of the carriers 76 is the same direction as the rotational direction of the lower surface plate 73 (counterclockwise), and a revolving speed ratio of the carriers 76 is 1 per the predetermined time period T1. As a result, a relative rotational speed ratio between the lower surface plate 73 and the carriers 76 is 2 (L•P2 in FIG. 13). On the other hand, since the upper surface plate 72 rotates in the clockwise direction at the rotational speed ratio of 1, the relative rotational speed ratio between the upper surface plate 72 and the carrier 76 is also 2 (U•P2 in FIG. 13).

Note that other polishing conditions for the first polishing process include the following, for example.

Polishing pressure several hundred g/cm2

Flow rate of polishing agent several hundred cc/min

When the first polishing process (S25) is performed under the above-described conditions, as shown in FIG. 8, a mirror-finish processing is performed on both the sides 41, 42 of the lid substrate wafer 40.

In the first polishing process (S25), in order to improve the surface accuracy of the bonding surface 41 of the lid substrate wafer 40, it is necessary to use relatively soft polishing pads P such as the above-mentioned cerium pad etc. Therefore, the polishing pads P wrap around as far as a peripheral edge of a division wall 43 of the recessed portion 3a, the recessed portion 3a becoming the bonding surface 41, such that the bonding surface 41 has a curved shape with the thickness gradually becoming thinner from the center toward the circumferential edge of the division wall 43. As a result, compared with a flat surface area of the bonding surface 41 (a bonding area D1) after the lapping process (S24) (refer to FIG. 7), a bonding area D2 of the bonding surface after the first polishing process (S25) becomes smaller, and there is a possibility that both wafers cannot be bonded in a satisfactory manner in a bonding process that is described below.

Therefore, in the embodiment, a second polishing process (S26) is performed on the lid substrate wafer 40 that has undergone the first polishing process (S25). When the second polishing process (S26) is performed, first, the polishing pads P are adhered to the pad retaining portions 72a, 73a. In the second polishing process (S26) of the embodiment, different materials are respectively used for each of the polishing pads P of the surface plates 72, 73. In concrete terms, a polishing pad (a second polishing pad) P made from urethane foam is used for the lower surface plate 73. The polishing pad P made from the urethane foam is formed by impregnating a nonwoven fabric with urethane foam resin, and it is a harder polishing pad P compared with the above-described cerium pad.

On the other hand, for the pad retaining portion 72a of the upper surface plate 72, a polishing pad (for example, a third polishing pad) P (for example, SUBA (registered trademark)) with a continuous foam structure based on the nonwoven fabric is adopted. More specifically, a polishing pad P that is softer than the urethane foam is adhered to the pad retaining portion 72a of the upper surface plate 72. As a result of this, it is possible to reduce resistance between the rear surface 42 and the upper surface plate 72 compared with resistance between the bonding surface 41 and the lower surface plate 73. As a result of this, polishing can be actively performed on a surface sag section since it is possible to secure a faster polishing speed on the bonding surface 41 compared with a polishing speed on the rear surface 42. Note that the rotational directions and the rotational speed ratios of the respective surface plates 72, 73 and of the respective gears 74, 75, pressure levels, the flow rate of the polishing agent etc. and other polishing conditions are similar to the above-described polishing conditions of the first polishing process (S25).

When the second polishing process (S26) is performed under the above-described conditions, the polishing pad P made from the urethane foam uniformly distributes the polishing agent W over all the area of the lid substrate wafer 40 while retaining the polishing agent W. As a result of this, as shown in FIG. 9, a tip end section of the bonding surface 41 is mainly polished, and the bonding surface 41 becomes a flat surface of a bonding area D3. Note that in the embodiment, it is possible to form the bonding area D3 that is approximately 90% to 95% of the bonding area D1 after the lapping process. In the above-described manner, the second wafer forming process (S20) is completed.

Next, on each of the routing electrodes 27, 28 of the base substrate wafer formed in the first wafer forming process (S10), the piezoelectric vibrating reed 5 is mounted respectively via the bump B, which is gold or the like (S31). Then, an overlapping process (S32) is performed in which the base substrate wafer and the lid substrate wafer 40, both of which are formed in the above-described respective wafer forming processes, are overlapped with each other. In concrete terms, both of the wafers are aligned at correct locations using reference marks etc., which are not shown in the drawings, as an indication. As a result of this, the mounted piezoelectric vibrating reed 5 is in a state of being housed in the cavity C which is surrounded by the recessed portion 3a formed in the lid substrate wafer 40 and by the base substrate wafer.

After the overlapping process, the two overlapped sheets of wafers are put into an anodic bonding device, which is not shown in the drawings, and in a state in which outer peripheral portions of the wafers are clamped by a retaining mechanism, which is not shown in the drawings, a bonding process (S33) is performed in which the anodic bonding is performed by applying a predetermined voltage under a predetermined temperature atmosphere. In concrete terms, the predetermined voltage is applied to a point between the bonding layer 23 and the lid substrate wafer 40. Then, an electrochemical reaction takes place in an interface between the bonding layer 23 and the lid substrate wafer 40, and both are firmly adhered to each other and anodically bonded. As a result of this, it is possible to enclose the piezoelectric vibrating reed 5 in the cavity C and to obtain a wafer bonded body in which the base substrate wafer and the lid substrate wafer 40 are bonded.

Subsequently, the pair of external electrodes 6, 7 that are electrically connected to the pair of through electrodes 8, 9, respectively, are formed and the frequency of the piezoelectric vibrator 1 is fine tuned. Then, the wafer bonded body is cut into small pieces and an inspection of internal electrical characteristics is performed, thereby forming a package (the piezoelectric vibrator 1) that houses the piezoelectric vibrating reed 5.

In this way, the embodiment has a structure in which, with respect to the lid substrate wafer 40 on which the mirror-finish polishing is performed in the first polishing process, the polishing pad P made from the urethane form is used for polishing the bonding surface 41 side in the second polishing process.

According to this structure, by using the polishing pad P made from the urethane foam, which is harder than the polishing pad P made from the cerium pad etc., it is possible to perform polishing on the peripheral edge portion of the bonding surface 41 without causing the surface sag, while maintaining the surface accuracy of the bonding surface 41 that is processed in the first polishing process. More specifically, since the polishing pad P made from the urethane foam does not wrap around the peripheral edge of the bonding surface 41 of the lid substrate wafer 40 but only slides on the tip end section of the bonding surface 41, it is possible to remove a surface sag section by actively polishing the tip end section. In this way, it is possible to flatten the bonding surface 41. Therefore, since it is possible to bond both the wafers in a state in which the bonding area (for example, the bonding area D3) is secured when both of the wafers are bonded, it is possible to maintain the airtightness in the cavity C. As a result, it is possible to provide the piezoelectric vibrator 1 that has excellent vibration characteristics and is highly reliable.

(Oscillator)

Next, one embodiment of an oscillator according to the invention will be described with reference to FIG. 14.

Figure 14:
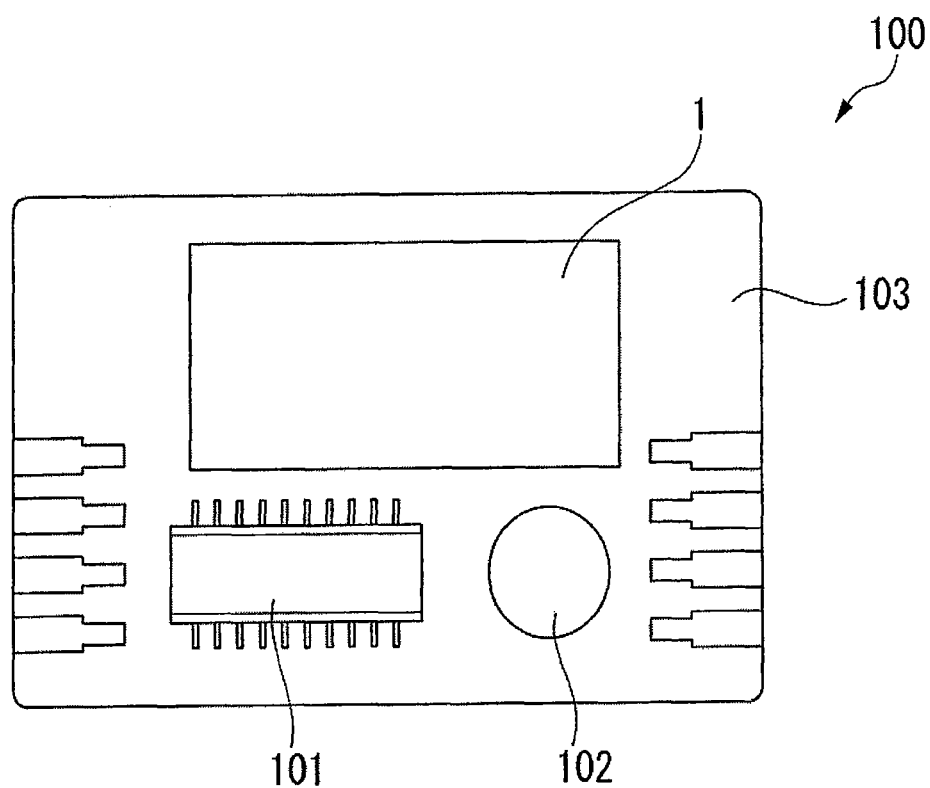
FIG. 14 is a structural view showing one embodiment of an oscillator according to the invention.

In an oscillator 100 of the embodiment, the piezoelectric vibrator 1 is formed as an oscillation element that is electrically connected to an integrated circuit 101 as shown in FIG. 14. The oscillator 100 is provided with a substrate 103 on which an electronic component 102 such as a capacitor is mounted. The above-described integrated circuit 101 for the oscillator is mounted on the substrate 103, and the piezoelectric vibrator 1 is mounted in the vicinity of the integrated circuit 101. The electronic component 102, the integrated circuit 101 and the piezoelectric vibrator 1 are respectively and electrically connected by wiring patterns, which are not shown in the drawings. Note that each of the structural components is molded by resin, which is not shown in the drawings.

In the oscillator 100 structured in this manner, when a voltage is applied to the piezoelectric vibrator 1, the piezoelectric vibrating reed 5 in the piezoelectric vibrator 1 vibrates. The vibration is converted to an electrical signal by a piezoelectric property of the piezoelectric vibrating reed 5, and input to the integrated circuit 101 as an electrical signal. The input electrical signal is subjected to various types of processing by the integrated circuit 101 and is output as a frequency signal. Thus, the piezoelectric vibrator 1 functions as an oscillation element.

Further, by selectively setting the structure of the integrated circuit 101, for example, to an RTC (real time clock) module or the like in response to demand, in addition to a single-function oscillator for a timepiece and the like, it is possible to add a function of controlling an operation date or time of the device or an external device or a function of providing time or a calendar.

As described above, since the oscillator 100 of the embodiment is provided with the piezoelectric vibrator 1 with improved quality, similarly, the quality of the oscillator 100 itself can also be improved. In addition to this, stable and highly accurate frequency signals can be obtained over a long period of time.

(Electronic Device)

Figure 15:
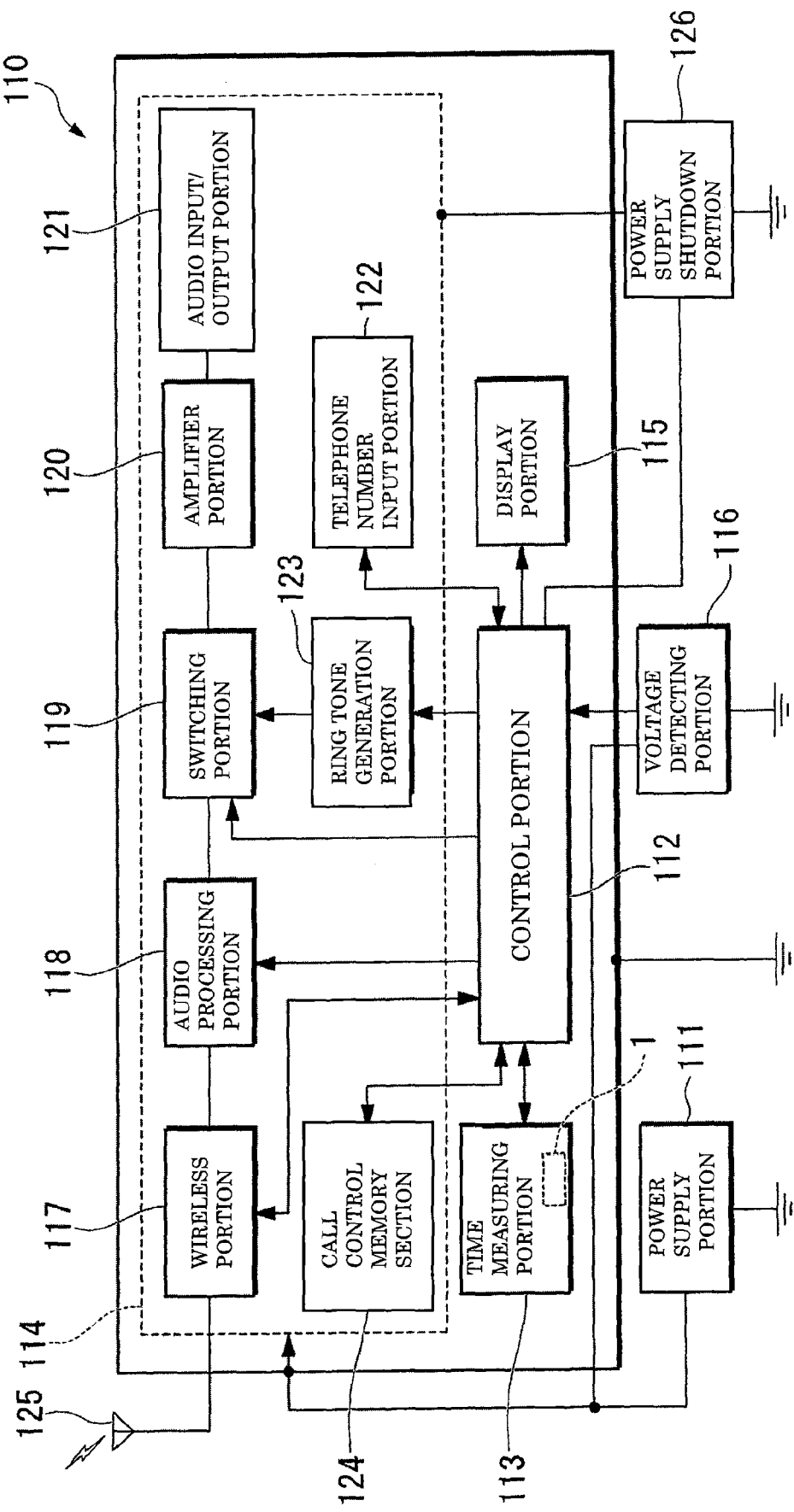
FIG. 15 is a structural view showing one embodiment of an electronic device according to the invention.

Next, one embodiment of an electronic device according to the invention will be described with reference to FIG. 15. Note that a portable information device 110 having the above-described piezoelectric vibrator 1 will be described as an example of the electronic device. First, the portable information device 110 according to the embodiment is represented by a mobile phone, for example, and is made by developing and improving a wrist watch in the related art. The external appearance is similar to the wrist watch, and a liquid crystal display is arranged in a section corresponding to a dial plate so that current time and the like can be displayed on its screen. When being used as a communication device, it can be removed from the wrist, and communication similar to a mobile phone of related art can be performed using a speaker and a microphone incorporated in an inner side section of a band. However, as compared to the mobile phone of the related art, it is dramatically compact and lightweight.

Next, the structure of the portable information device 110 of the embodiment will be described. As shown in FIG. 15, the portable information device 110 is provided with the piezoelectric vibrator 1 and a power supply portion 111 to supply electric power. The power supply portion 111 is formed by a lithium secondary battery, for example. A control portion 112 that performs various types of control, a time measuring portion 113 that counts time etc., a communication portion 114 that performs communication with the outside, a display portion 115 that displays various types of information, and a voltage detection portion 116 that detects a voltage of each of the functional portions are connected in parallel to the power supply portion 111. Electric power is supplied to each of the functional portions by the power supply portion 111.

The control portion 112 controls each of the functional portions and thereby performs operation control of the entire system, such as transmission and reception of audio data, measurement and display of current time, and the like. Further, the control portion 112 is provided with a ROM into which a program is written in advance, a CPU that reads and executes the program written into the ROM, a RAM that is used as a work area of the CPU, and the like.

The time measuring portion 113 is provided with an integrated circuit that incorporates an oscillation circuit, a register circuit, a counter circuit and an interface circuit etc., and the piezoelectric vibrator 1. When a voltage is applied to the piezoelectric vibrator 1, the piezoelectric vibrating reed 5 vibrates. The vibration is converted to an electrical signal due to piezoelectric property of crystal, and is input to the oscillation circuit as the electrical signal. The output of the oscillation circuit is binarized and measured by the register circuit and the counter circuit. Then, signal transmission and reception with the control portion 112 is performed via the interface circuit, and current time, current date or calendar information etc. is displayed on the display portion 115.

The communication portion 114 has similar functions to those of the mobile phone of the related art, and is provided with a wireless portion 117, an audio processing portion 118, a switching portion 119, an amplifier portion 120, an audio input/output portion 121, a telephone number input portion 122, a ring tone generation portion 123 and a call control memory portion 124.

The wireless portion 117 carries out transmission and reception of various types of data, such as audio data, with a base station via an antenna 125. The audio processing portion 118 encodes and decodes an audio signal input from the wireless portion 117 or the amplifier portion 120. The amplifier portion 120 amplifies a signal input from the audio processing portion 118 or the audio input/output portion 121 to a predetermined level. The audio input/output portion 121 is formed by a speaker, a microphone and the like, and makes a ring tone and incoming audio louder and collects audio.

The ring tone generation portion 123 generates a ring tone in response to a call from the base station. The switching portion 119 switches the amplifier portion 120 connected to the audio processing portion 118 to the ring tone generation portion 123 only when a call arrives, so that the ring tone generated in the ring tone generation portion 123 is output to the audio input/output portion 121 via the amplifier portion 120.

Note that the call control memory portion 124 stores a program relating to incoming and outgoing call control for communications. The telephone number input portion 122 includes, for example, numeric keys from 0 to 9 and other keys and the telephone number of a call destination is input by depressing these numeric keys and the like.

The voltage detection portion 116 detects a voltage drop and notifies the control portion 112 of it when a voltage applied by the power supply portion 111 to each of the functional portions, such as the control portion 112, drops below a predetermined value. The predetermined voltage value in this case is a value pre-set as the lowest voltage necessary to operate the communication portion 114 stably, and is, for example, about 3V. When receiving a notification of the voltage drop from the voltage detection portion 116, the control portion 112 disables operations of the wireless portion 117, the audio processing portion 118, the switching portion 119 and the ring tone generation portion 123. In particular, it is essential to stop the operation of the wireless portion 117 that consumes a large amount of electric power. Furthermore, a message informing that the communication portion 114 is unavailable due to insufficient battery power is displayed on the display portion 115.

More specifically, it is possible to disable the operation of the communication portion 114 by the voltage detection portion 116 and the control portion 112, and to display the notification message on the display portion 115. Although a character message may be used for this display, an x (cross) mark may be put on a telephone icon displayed on an upper section of a display screen of the display portion 115, as a more intuitive display.

Note that, by providing a power supply shutdown portion 126 that is capable of selectively shutting down the power supply to portions involved with the function of the communication portion 114, it is possible to stop the function of the communication portion 114 in a more reliable manner.

As described above, since the portable information device 110 of the embodiment is provided with the piezoelectric vibrator 1 with improved quality, it is also possible to similarly improve the quality of the portable information device itself. In addition to this, it is possible to display stable and highly accurate clock information over a long period of time.

Next, one embodiment of a radio timepiece according to the invention will be described with reference to FIG. 16.

Figure 16:
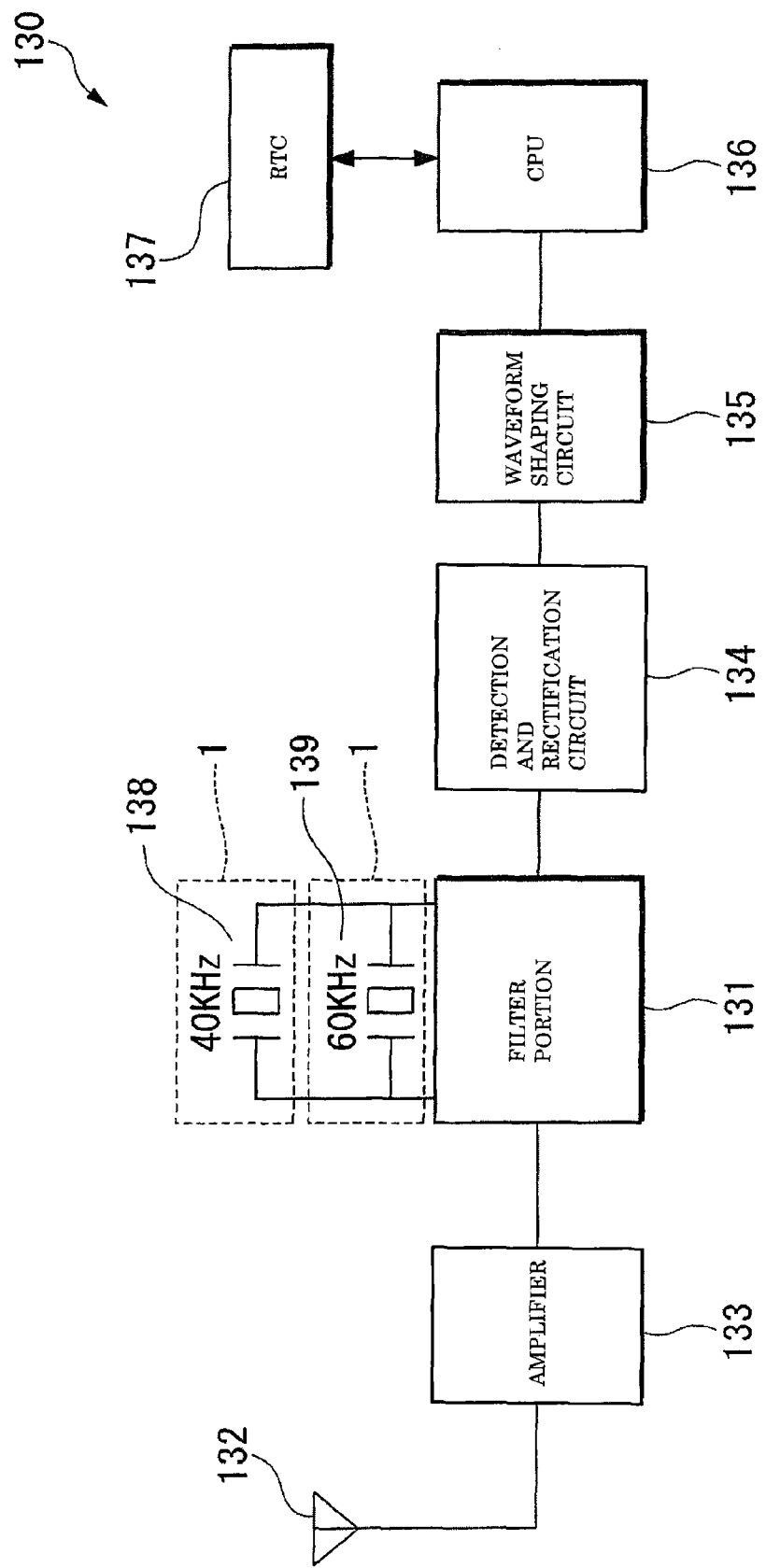
FIG. 16 is a structural view showing one embodiment of a radio timepiece according to the invention.

A radio timepiece 130 of the embodiment is provided with the piezoelectric vibrator 1 that is electrically connected to a filter portion 131 as shown in FIG. 16, and is a timepiece that has a function of receiving a standard wave including clock information, and a function of automatically correcting the standard wave to a correct time and displaying it.

In Japan, transmitting stations (transmitter stations) for transmitting standard waves are located in Fukushima prefecture (40 kHz) and Saga prefecture (60 kHz), and transmit standard waves, respectively. A long wave corresponding to 40 kHz or 60 kHz has a property of propagating on the ground surface and also has a property of propagating while being reflected by an ionized layer and the ground surface. Accordingly, the propagation range is wide and the above-mentioned two transmitting stations cover the entire area of Japan.

(Radio Timepiece)

Hereinafter, a functional structure of the radio timepiece 130 will be described in detail.

An antenna 132 receives a standard wave that is a long wave of 40 kHz or 60 kHz. The standard wave, which is a long wave, is a wave that is obtained by performing AM modulation of time information, which is called a time code, on a carrier wave of 40 kHz or 60 kHz. The received standard wave, which is a long wave, is amplified by an amplifier 133, and is filtered and tuned by the filter portion 131 having a plurality of the piezoelectric vibrators 1.

The piezoelectric vibrators 1 of the embodiment are respectively provided with crystal oscillator portions 138, 139 having resonance frequencies of 40 kHz and 60 kHz, which are the same as the above-described carrier frequencies.

Further, the filtered signal with a predetermined frequency is detected and demodulated by a detection and rectification circuit 134. Then, the time code is taken out through a waveform shaping circuit 135 and is counted by a CPU 136. The CPU 136 reads information of a current year, cumulative days, a day of the week, a time of day, and the like. The read information is reflected on an RTC 137 and correct time information is displayed.

Since the carrier wave has a frequency of 40 kHz or 60 kHz, the above-described vibrator having a tuning-fork type structure is preferably used as the crystal oscillator portions 138, 139.

Note that, although the above-described explanation is made using an example in Japan, the frequencies of long wave standard waves are different in overseas countries. For example, the standard wave with a frequency of 77.5 KHz is used in Germany. Accordingly, when the radio timepiece 130 that is also compatible in overseas countries is incorporated into a portable device, the piezoelectric vibrator 1 having a frequency different from the frequency used in Japan is necessary.

As described above, since the radio timepiece 130 of the embodiment is provided with the piezoelectric vibrator 1 with improved quality, it is also possible to similarly improve the quality of the radio timepiece itself. In addition to this, it is possible to count time stably and highly accurately over a long period of time.

Hereinabove, the embodiment of the invention is described in detail with reference to the drawings. However, specific structures are not limited to the embodiment, and design modifications and the like that do not depart from the spirit of the invention are also included.

For example, although in the above-described embodiment, the piezoelectric vibrating reed 5 of a tuning-fork type is described as an example, it is not limited to the tuning-fork type. For example, a thickness shear vibrating reed or an AT vibrating reed may be mounted in the cavity, and when these vibrating reeds are electrically connected to the external electrodes, the through electrodes may be formed using the above-described method.

Further, in the above-described embodiment, the description is made for the two-layer structure type in which the piezoelectric vibrating reed 5 is housed in the cavity C formed between the base substrate 2 and the lid substrate 3. However, without being limited to this, a three-layer structure type can also be adopted in which the piezoelectric substrate having the piezoelectric vibrating reed 5 formed thereon is bonded to be sandwiched from above and below by the base substrate 2 and the lid substrate 3.

Further, in the above-described embodiment, with respect to the polishing processes, the description is made of the four-way method in which all the respective surface plates 72, 73 and the respective gears 74, 75 are independently driven to rotate. However, without being limited to this, a two-way method in which both the respective surface plates 72, 73 are fixed, a three-way method in which only the upper surface plate 72 is fixed and the like may also be adopted.

Further, in the above-described embodiment, the two-sided polishing device 71 manufactured by the company S in which the internal gear 75 rotates independently is used. However, a two-sided polishing device having a structure in which the internal gear 75 does not rotate independently but rotates with the lower surface plate while being fixed to the lower surface plate may be used.

Further, a design change can be made to the rotational speeds and the rotational directions of the respective surface plates 72, 73 and of the respective gears 74, 75 as necessary.

Further, in the above-described embodiment, the description is made of a case in which both the surfaces 41, 42 of the lid substrate wafer 40 are polished using the two-sided polishing device 71. However, it is considered sufficient for at least the bonding surface 41 to be polished. More specifically, only the bonding surface 41 may be polished using a one-sided polishing device.

It is possible to improve surface accuracy of a bonding surface of a glass substrate and to maintain airtightness in a cavity by securing a bonding area.

What is claimed is:

1. A glass substrate polishing method including polishing processes for polishing a surface of a glass substrate while supplying a polishing agent, the glass substrate polishing method comprising:
    polishing the surface of the glass substrate with a first polishing process using a first polishing pad comprising a polishing cloth, and subsequently polishing the surface of the glass substrate with a second polishing process using a second polishing pad comprising urethane foam, where the second polishing pad has a higher degree of hardness than the first polishing pad.

2. The glass substrate polishing method according to claim 1, further comprising forming a recessed portion on the surface of the glass substrate, and polishing a tip end surface of a division wall, the division wall surrounding a periphery of the recessed portion.

3. The glass substrate polishing method according to claim 1, wherein the first polishing process and the second polishing process comprise using a two-sided polishing device and simultaneously polishing a rear surface of the glass substrate.

4. The glass substrate polishing method according to claim 3, wherein the two-sided polishing device comprises a planetary gear mechanism with a disc-shaped carrier that includes a retaining hole that houses the glass substrate, and a lower surface plate and an upper surface plate on upper and lower sides of the carrier respectively, and adhering one of the first polishing pad and the second polishing pad thereto, and
    wherein the lower surface plate and the upper surface plate are pressed against the surface and the rear surface of the glass substrate via one of the first polishing pad and the second polishing pad, and the carrier rotates about an a carrier axis while revolving around an axis line, and a rotational direction of the lower surface plate is opposite to a rotational direction of the upper surface plate.

5. The glass substrate polishing method according to claim 4, wherein in the second polishing process, the second polishing pad is on the lower surface plate and polishes the surface of the glass substrate, and a third polishing pad comprising a material that is softer than the urethane foam is on the upper surface plate and simultaneously polishes the rear surface side of the glass substrate.

6. A package manufacturing method for enclosing an electronic component in a cavity between a plurality of bonded substrates, the package manufacturing method comprising:
    forming a recessed portion for the cavity on a surface of a first substrate among the plurality of substrates;
    polishing a tip end surface of a division wall that surrounds a periphery of the recessed portion, using the glass substrate polishing method according to claim 1; and
    anodically bonding a second substrate among the plurality of substrates onto the tip end surface of the division wall.

7. A piezoelectric vibrator manufactured using the package manufacturing method according to claim 6.

8. An oscillator, wherein the piezoelectric vibrator according to claim 7 is electrically connected to an integrated circuit as an oscillation element.

9. An electronic device, wherein the piezoelectric vibrator according to claim 7 is electrically connected to a time measuring portion.

10. A radio timepiece, wherein the piezoelectric vibrator according to claim 7 is electrically connected to a filter portion.

11. A glass substrate polishing method including polishing processes for polishing a surface of a glass substrate while supplying a polishing agent, the glass substrate polishing method comprising:
    forming a recessed portion having a division wall on the surface of the glass substrate, where the division wall surrounds a periphery of the recessed portion; and
    polishing a tip end surface of a division wall with a first polishing process using a first polishing pad comprising a polishing cloth, and with a second polishing process using a second polishing pad comprising urethane foam.

12. A glass substrate polishing method including polishing processes for polishing a surface of a glass substrate while supplying a polishing agent, the glass substrate polishing method comprising:
    polishing the surface of the glass substrate with a first polishing process using a first polishing pad comprising a polishing cloth, and polishing the surface of the glass substrate with a second polishing process using a second polishing pad comprising urethane foam,
    wherein the first polishing process and the second polishing process comprise using a two-sided polishing device and simultaneously polishing a rear surface of the glass substrate.

* * * * *